(12) United States Patent
Zhong et al.

(10) Patent No.: US 11,043,613 B2
(45) Date of Patent: Jun. 22, 2021

(54) LIGHT EMITTING DIODE DEVICE AND METHOD FOR MANUFACTURING THE SAME

(71) Applicant: XIAMEN SAN'AN OPTOELECTRONICS CO., LTD., Xiamen (CN)

(72) Inventors: Zhibai Zhong, Xiamen (CN); Jinjian Zheng, Xiamen (CN); Lixun Yang, Xiamen (CN); Chia-En Lee, Xiamen (CN); Chen-Ke Hsu, Xiamen (CN); Junyong Kang, Xiamen (CN)

(73) Assignee: Xiamen San'An Optoelectronics Co., Ltd., Fujian (CN)

( * ) Notice: Subject to any disclaimer, the term of this patent is extended or adjusted under 35 U.S.C. 154(b) by 0 days.

(21) Appl. No.: 16/456,155

(22) Filed: Jun. 28, 2019

(65) Prior Publication Data

US 2019/0319172 A1      Oct. 17, 2019

Related U.S. Application Data

(63) Continuation-in-part of application No. PCT/CN2017/097846, filed on Aug. 17, 2017.

(30) Foreign Application Priority Data

Jan. 26, 2017   (CN) .......................... 201710057326.1

(51) Int. Cl.
*H01L 33/44*    (2010.01)
*H01L 33/00*    (2010.01)
(Continued)

(52) U.S. Cl.
CPC .......... *H01L 33/44* (2013.01); *H01L 33/0066* (2013.01); *H01L 33/0093* (2020.05);
(Continued)

(58) Field of Classification Search
None
See application file for complete search history.

(56) References Cited

U.S. PATENT DOCUMENTS

2013/0207118 A1*    8/2013   Xiao ....................... H01L 33/58
                                                                 257/76

FOREIGN PATENT DOCUMENTS

CN           200986927 Y       12/2007
CN           102130252 A        7/2011
(Continued)

OTHER PUBLICATIONS

Search Report appended to an Office Action, which was issued to Chinese counterpart application No. 201710057326.1 by the CNIPA dated Jul. 3, 2018, with an English translation thereof.
(Continued)

*Primary Examiner* — Jack S Chen
(74) *Attorney, Agent, or Firm* — Rosenberg, Klein & Lee

(57) ABSTRACT

A light emitting diode (LED) device includes a light emitting epitaxial layer having opposite first and second surfaces and a plurality of microlenses formed on the first surface. The light emitting epitaxial layer includes a first type semiconductor layer defining the first surface, a second type semiconductor layer defining the second surface, and a light emitting layer disposed between the first and second type semiconductor layers and spaced apart from the first and second surfaces. The microlenses are formed on the first surface and formed of a light transmissible substrate for epitaxial growth of the light emitting epitaxial layer. A method for manufacturing the light emitting diode device is also disclosed.

8 Claims, 18 Drawing Sheets

(51) Int. Cl.
    *H01L 33/24*      (2010.01)
    *H01L 33/30*      (2010.01)
    *G02B 3/02*           (2006.01)

(52) U.S. Cl.
    CPC .............. *H01L 33/24* (2013.01); *H01L 33/30* (2013.01); *G02B 3/02* (2013.01); *H01L 2933/0025* (2013.01)

(56) References Cited

FOREIGN PATENT DOCUMENTS

| | | |
|---|---|---|
| CN | 102130285 A | 7/2011 |
| CN | 106257696   | 12/2016 |
| CN | 106876547 A | 6/2017 |

OTHER PUBLICATIONS

Search Report issued to PCT application No. PCT/CN2017/097846 by the CNIPA dated Nov. 29, 2017.

* cited by examiner

LIGHT EMITTING DIODE DEVICE AND METHOD FOR MANUFACTURING THE SAME

CROSS-REFERENCE TO RELATED APPLICATION

This application is a continuation-in-part (CIP) of International Application No. PCT/CN2017/097846, filed on Aug. 17, 2017, which claims priority to Chinese Invention Patent Application No. 201710057326.1, filed on Jan. 26, 2017.

FIELD

The disclosure relates to a light emitting device and a method for manufacturing the same, and more particularly to a light emitting diode (LED) device and a method for manufacturing the same.

BACKGROUND

Light emitting diodes (LEDs) have superior optoelectronic characteristics in respects of energy consumption, lifespan, operational stability such as light-emitting wavelength stability, size, response speed, etc., and are widely applied in various fields such as lighting, household appliances, displays and indicator lamps.

However, light emitting efficiency of a conventional LED is limited by many factors. For example, a lattice mismatch between an epitaxial layer and an underlying growth substrate may cause low internal quantum efficiency of the conventional LED. Or an insulating substrate made of sapphire, aluminum nitride (AlN), etc., which is commonly used for making a lateral LED chip and has a relatively low thermal conductivity, may lead to a higher temperature at the p-n junctions of the LED chip. In addition, the difference in refractive index between air and a semiconductor device including the conventional LED may adversely affect emission of light from the semiconductor device.

To enhance the light emitting efficiency of the conventional LED, many approaches have been proposed. For example, growth of epitaxial layers on a patterned sapphire substrate may reduce dislocation density to increase quality and light emitting efficiency of the LED thus formed. Removal of the sapphire substrate using laser lift-off techniques during manufacture of a conventional vertical high-power LED may alleviate problems regarding lateral current distribution and light emission blocked by electrodes.

SUMMARY

Therefore, an object of the disclosure is to provide an LED device that can alleviate at least one of the drawbacks of the prior art and the manufacturing method thereof.

According to one aspect of the present disclosure, a light emitting diode (LED) device includes a light emitting epitaxial layer and a plurality of microlenses.

The light emitting epitaxial layer has opposite first and second surfaces and includes a first type semiconductor layer that defines the first surface, a second type semiconductor layer that defines the second surface, and a light emitting layer that is disposed between the first and second type semiconductor layers and spaced apart from the first and second surfaces. The light emitting layer emits light toward the first surface to exit therefrom.

The microlenses are formed on the first surface and formed of a light transmissible substrate for epitaxial growth of the light emitting epitaxial layer.

According to another aspect of the disclosure, a method for manufacturing an LED device includes the following steps: epitaxially growing a light emitting layer on a first type semiconductor layer; epitaxially growing a second type semiconductor layer on the light emitting layer so that the first and second type semiconductor layers and the light emitting layer cooperatively define a light emitting epitaxial layer having opposite first and second surfaces respectively defined by the first and second type semiconductor layers; and forming a plurality of microlenses on the first surface of the light emitting epitaxial layer. The microlenses are formed of a light transmissible substrate and the light emitting layer emits light toward the first surface to exit therefrom.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
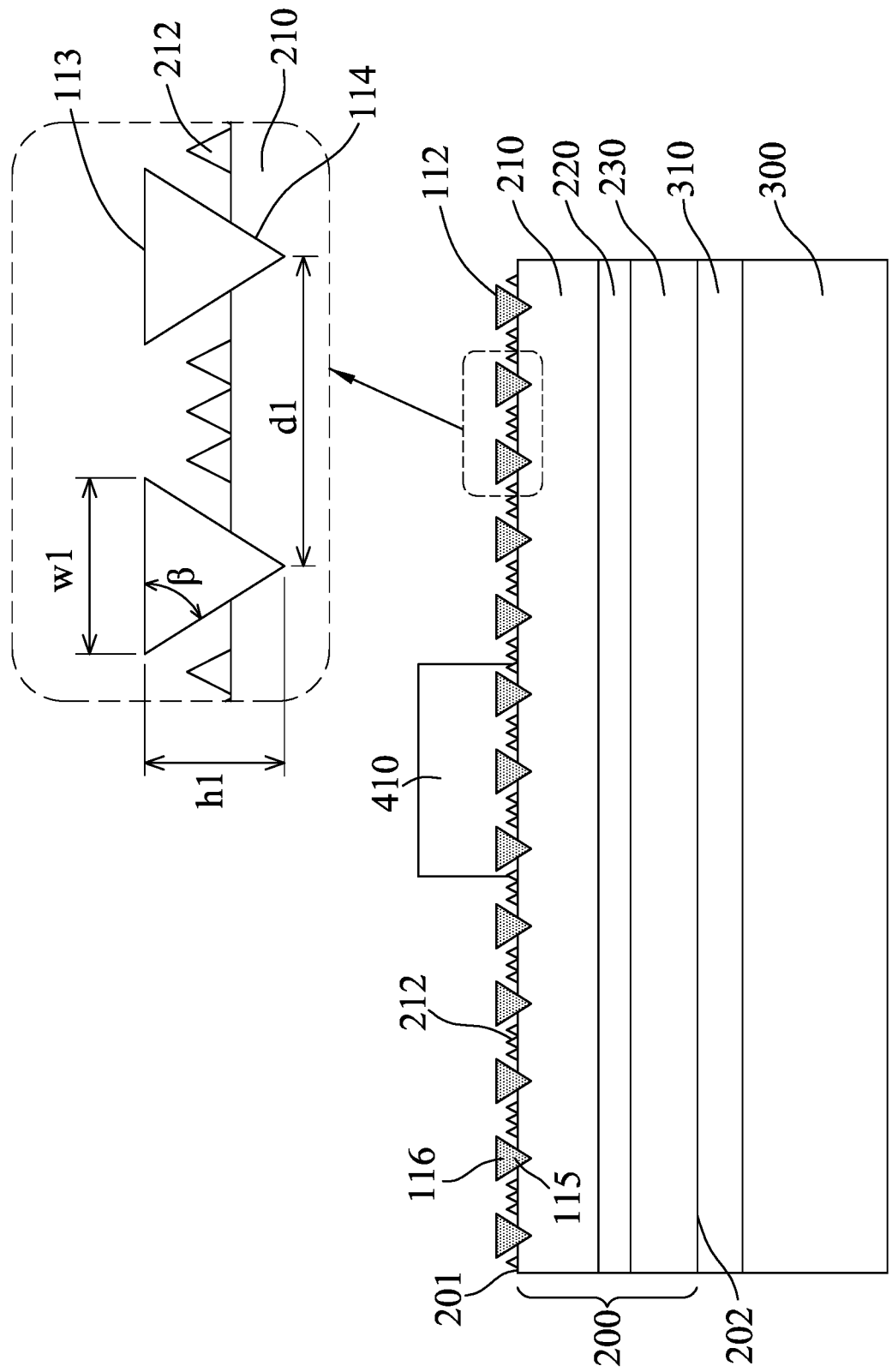
FIG. 1 is a schematic view showing a first embodiment of an LED device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
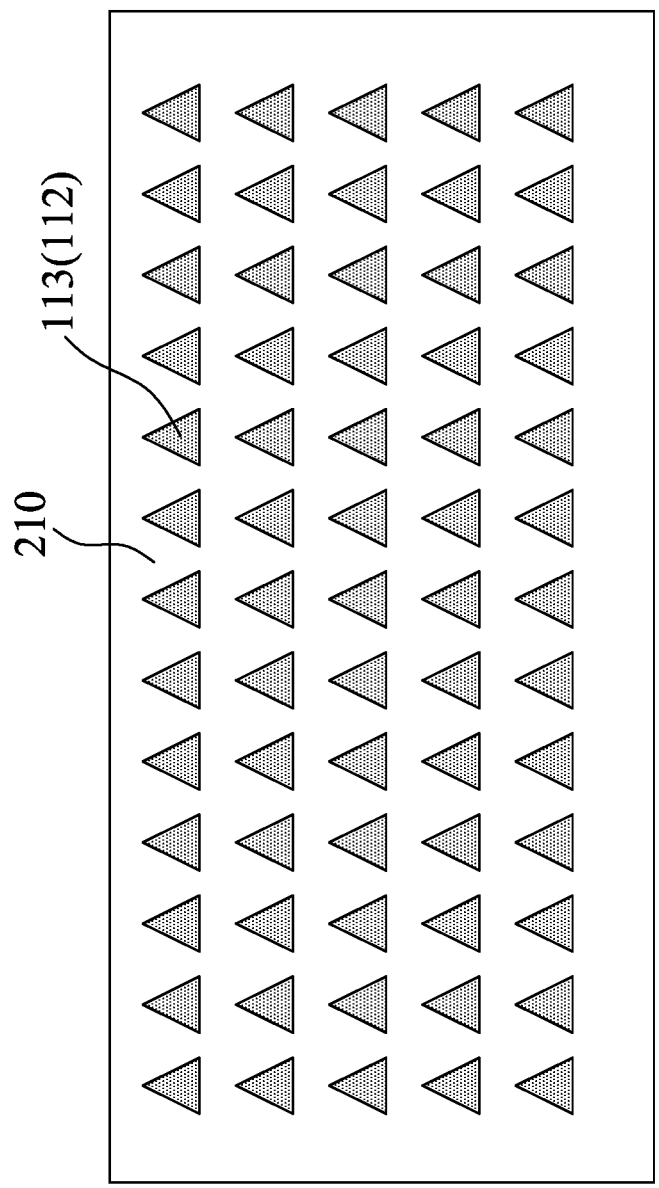
FIG. 2 is a schematically top view showing a distribution of microlenses of the LED device of FIG. 1.

Referring to FIGS. 1 and 2, a first embodiment of an LED device according to the disclosure includes a support structure 300, a bonding layer 310 formed on the support structure 300, and a light emitting epitaxial layer 200 and a top electrode 410 formed in order on the bonding layer 310. The support structure 300 may be an electroconductive substrate and be made of ceramics, metals or semiconductor materials such as silicon. In this embodiment, the support structure 300 is a silicon substrate. The bonding layer 310 may be made of a metal, a transparent conductive oxide or an electroconductive paste. The LED device may further include a contact layer and a mirror layer (not shown) disposed between the bonding layer 310 and the light emitting epitaxial layer 200.

The light emitting epitaxial layer 200 has a first surface 201 and a second surface 202 opposite to the first surface 201 and attached to the bonding layer 310. Specifically, the light emitting epitaxial layer 200 includes a first type semiconductor layer 210 defining the first surface 201, a second type semiconductor layer 230 defining the second surface 202, and a light emitting layer 220 disposed between the first and second type semiconductor layers 210, 230 and spaced apart from the first and second surfaces 201, 202. The light emitting layer 220 emits light toward the first surface 201 to exit therefrom.

The light emitting epitaxial layer 200 may be made of a group III-V compound semiconductor material containing elements of group III such as boron (B), aluminum (Al), gallium (Ga) or indium (In) and of group V such as nitrogen (N), phosphor (P) or arsenic (As). The first type semiconductor layer 210 may be one of a P-type semiconductor layer and an N-type semiconductor layer, and the second type semiconductor layer 230 is the other one of the P-type semiconductor layer and the N-type semiconductor layer. In this embodiment, the first type semiconductor layer 210 is the N-type semiconductor layer and the second type semiconductor layer 230 is the P-type semiconductor.

The light emitted from the light emitting layer 220 has a wavelength ranging from 200 nm to 1150 nm. For example, the wavelength of the light emitted from the light emitting layer 220 falls in one of the wavelength ranges of blue light and ultraviolet (UV) light, such as 200 nm to 280 nm (UV-C), 280 nm to 315 nm (UV-B), and 315 nm to 380 nm (UV-A).

The LED device further includes a plurality of microlenses 112 formed on the first surface 201 that is defined by the first type semiconductor layer 210 and serves as a light-exiting surface of the LED device. The microlenses 112 are formed of a patterned light transmissible substrate 100. Specifically, the microlenses 112 are parts of the patterned light transmissible substrate 100 that are retained on the light emitting epitaxial layer 200 after partial removal of the light transmissible substrate 100 from the light emitting epitaxial layer 200.

Each of the microlenses 112 has a dimension which tapers off along a direction from the first surface 201 toward the second surface 202 of the light emitting epitaxial layer 200. Each of the microlenses 112 has a top surface 113 spaced apart from the first surface 201, a side face or side surface 114 peripherally extending from the top surface 113 toward the first surface 201, a first portion 115 defining a portion of the side surface 114, and a second portion 116 extending from the first portion 115 and defining the top surface 113 and the remainder of the side face 114. The first portion 115 is embedded in the light emitting epitaxial layer 200 and the second portion 116 protrudes from the first surface 201 of the light emitting epitaxial layer 200. Each of the microlenses 112 has a width (w1) greater than λ/4, where λ, represents the wavelength of the light emitted from the light emitting layer 220, a height (h1) of 0.5 μm to 3.0 μm, an interior angle (β) included between the top surface 113 and the side surface 114 of 30° to 85°. The microlenses 112 are spaced apart from each other by a distance (d1) ranging from 1.0 μm to 6.0 μm. As shown in FIG. 1, in one form, each of the microlenses 112 is shaped as a prism with a tip end defined by the first portion 115, and has the height (h1) of 0.5 μm to 1.5 μm and the interior angle (β) of 60°. The above distance (d1) is the distance between the tip ends of two adjacent ones of the microlenses 112. In this embodiment, the LED device further includes a roughened structure 212 formed on a portion of the first surface 201 of the light emitting epitaxial layer 200 exposed from the microlenses 112.

Now referring to FIGS. 3 to 9, a first embodiment of a method for manufacturing method of an LED device is illustrated. In this embodiment, the LED device as shown in FIGS. 1 and 2 is made. The method includes steps S110 to S150.

Figure 3:
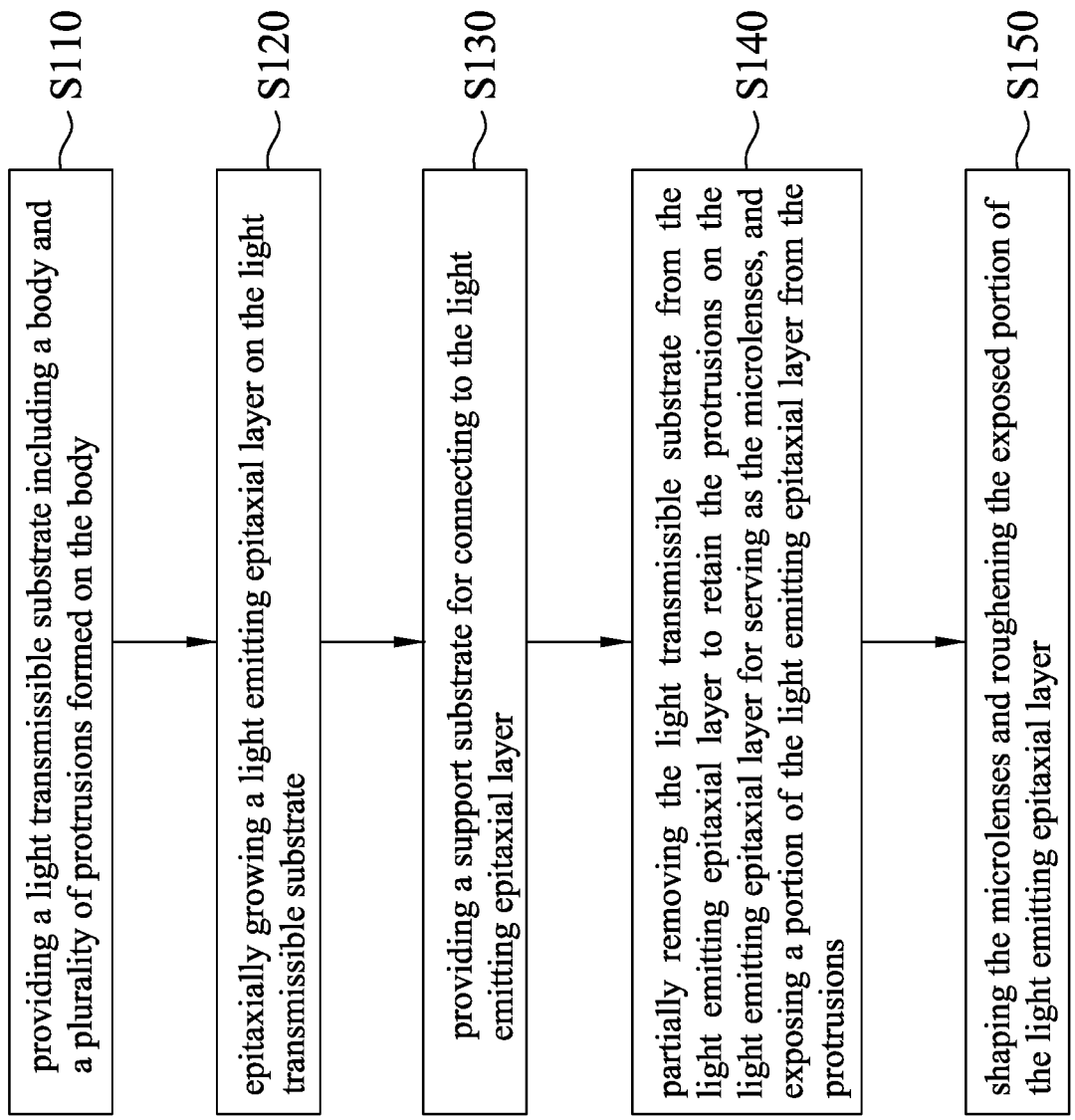
FIG. 3 is a flow chart illustrating a first embodiment of a method for manufacturing an LED device according to the disclosure.
Figure 4:
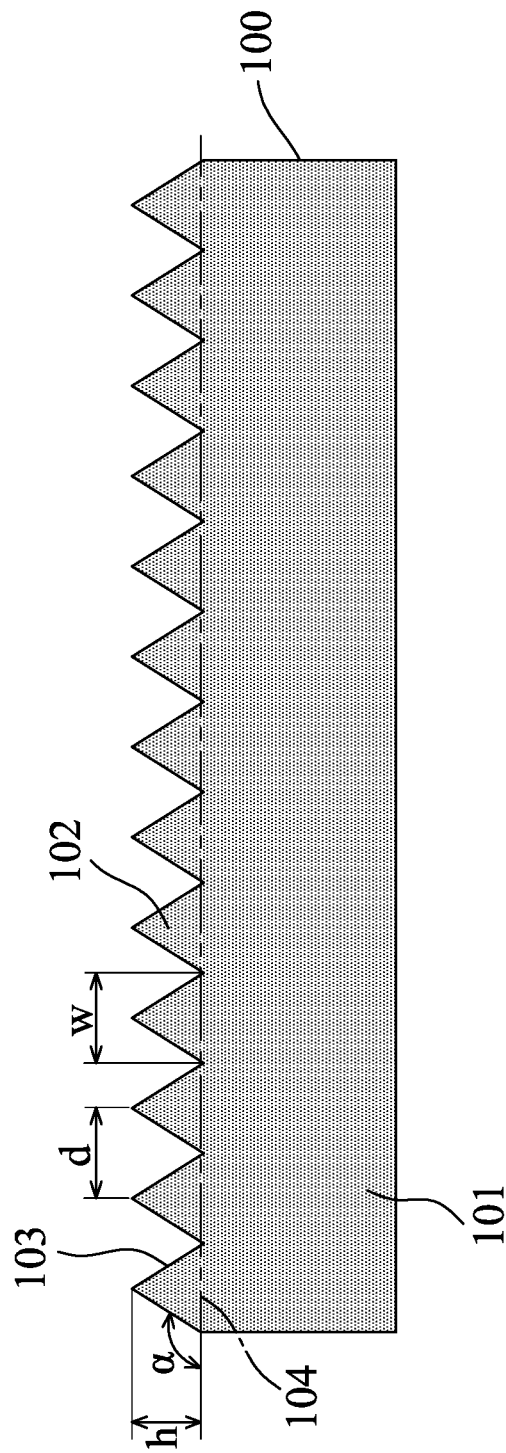
FIGS. 4 to 9 are schematic view illustrating consecutive steps of the method of FIG. 3.

As shown in FIGS. 3 and 4, in step S110, the light transmissible substrate 100 is provided and includes a body 101 and a plurality of protrusions 102 formed on the body 101 in an array. The light transmissible substrate 100 may be made of sapphire or aluminum nitride (AlN). In this embodiment, the light transmissible substrate 100 is made of sapphire, and the protrusions 102 are formed by dry etching and/or wet etching a surface of the light transmissible substrate 100 so as to form an interface 104 between the body 101 and the protrusions 102. Each of the protrusions 102 has a width (w) greater than λ/4, such as 2.0 μm, and a height (h) measured from the interface 104 and being of 1 μm to 3 μm. A distance (d) between any two adjacent ones of the protrusions 102 is of 1.0 μm to 6.0 μm. In this embodiment, each of the protrusions 102 extends from the body 101, and has a side face or side surface 103 extending from the interface 104 and an exterior angle (a) included between the side face 103 and the interface 104 ranging from 105° to 150°. In one example, the exterior angle (a) is 120°. In this embodiment, each of the protrusions 102 is prism-shaped and has a tip end distal to the interface 104. The above distance (d) is the distance between the tip ends of two adjacent ones of the protrusions 102.

Figure 5:
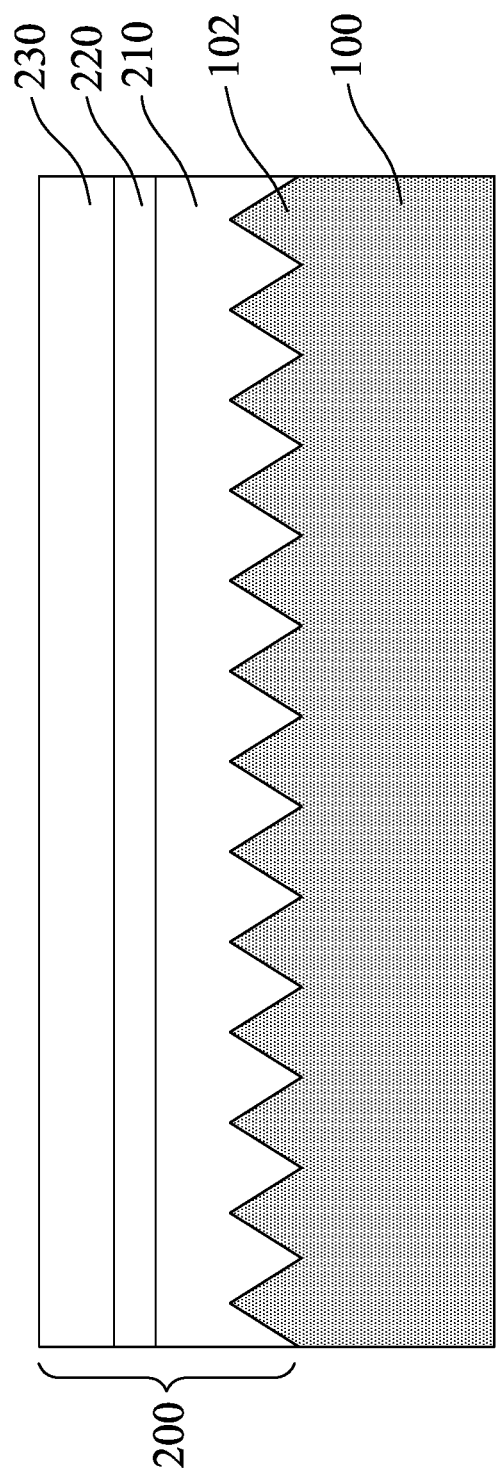

As shown in FIGS. 3 and 5, in step S120, the light emitting epitaxial layer 200 is epitaxially grown on the protrusions 102 of the light transmissible substrate 100. Specifically, first, the first type semiconductor layer 210 of the N-type semiconductor layer is epitaxially grown on the light transmissible substrate 100 to cover the protrusions 102. Then, the light emitting layer 220 is epitaxially grown on the N-type semiconductor layer 210, and the second type semiconductor layer 230 of the P-type semiconductor layer is epitaxially grown on the light emitting layer 220 so that the N- and P-type semiconductor layers 210, 230 respectively define the opposite first and second surfaces 201, 202 of the light emitting epitaxial layer 200. In one example, the method may further include forming one or more of a buffer layer, a two-dimensional nitride layered structure and a three-dimensional nitride island layer between the N-type semiconductor layer 210 and the light transmissible substrate 100. In another example, the method may further include forming a superlattice stress buffer layer between the N-type semiconductor layer 210 and the light emitting layer 220. In the other example, the method may further include forming an electron blocking layer between the light emitting layer 220 and the P-type semiconductor layer 230.

Figure 6:
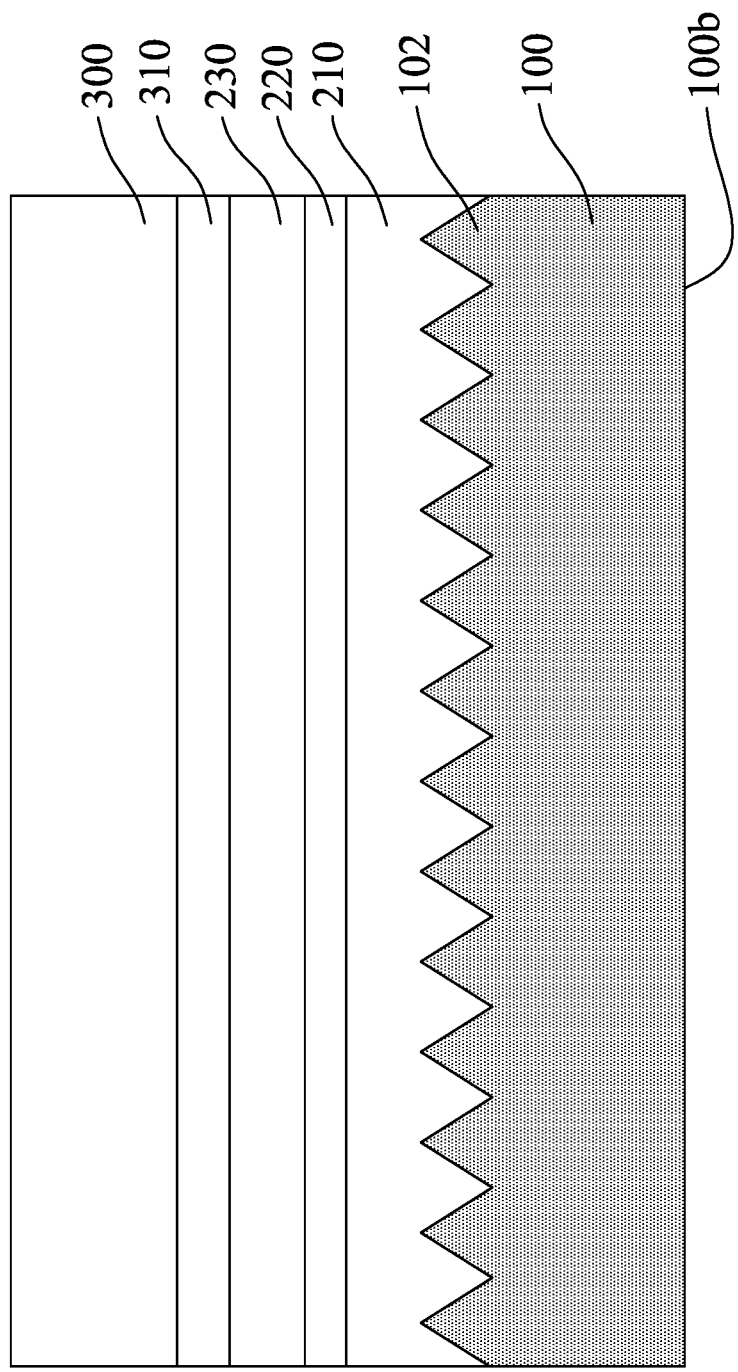

Referring to FIGS. 3 and 6, in step S130, the support substrate 300 is provided for connecting to the light emitting epitaxial layer 200 through bonding or adhering. In this embodiment, the support substrate 300 is bonded to the second surface 202 of the light emitting epitaxial layer 200 defined by the P-type semiconductor layer 230 via the bonding layer 310 formed between the P-type semiconductor layer 230 and the support substrate 300. In one example, the method further include forming contact and reflective layers on the second surface 202 of the light emitting epitaxial layer 200 defined by the P-type semiconductor layer 230 prior to formation of the bonding layer 310 and bonding of the support substrate 300 to the light emitting epitaxial layer 200. Alternatively, a back surface 100b of the light transmissible substrate 100 opposite to the protrusions 102 may be optionally thinned through grinding, and polished.

Figure 7:
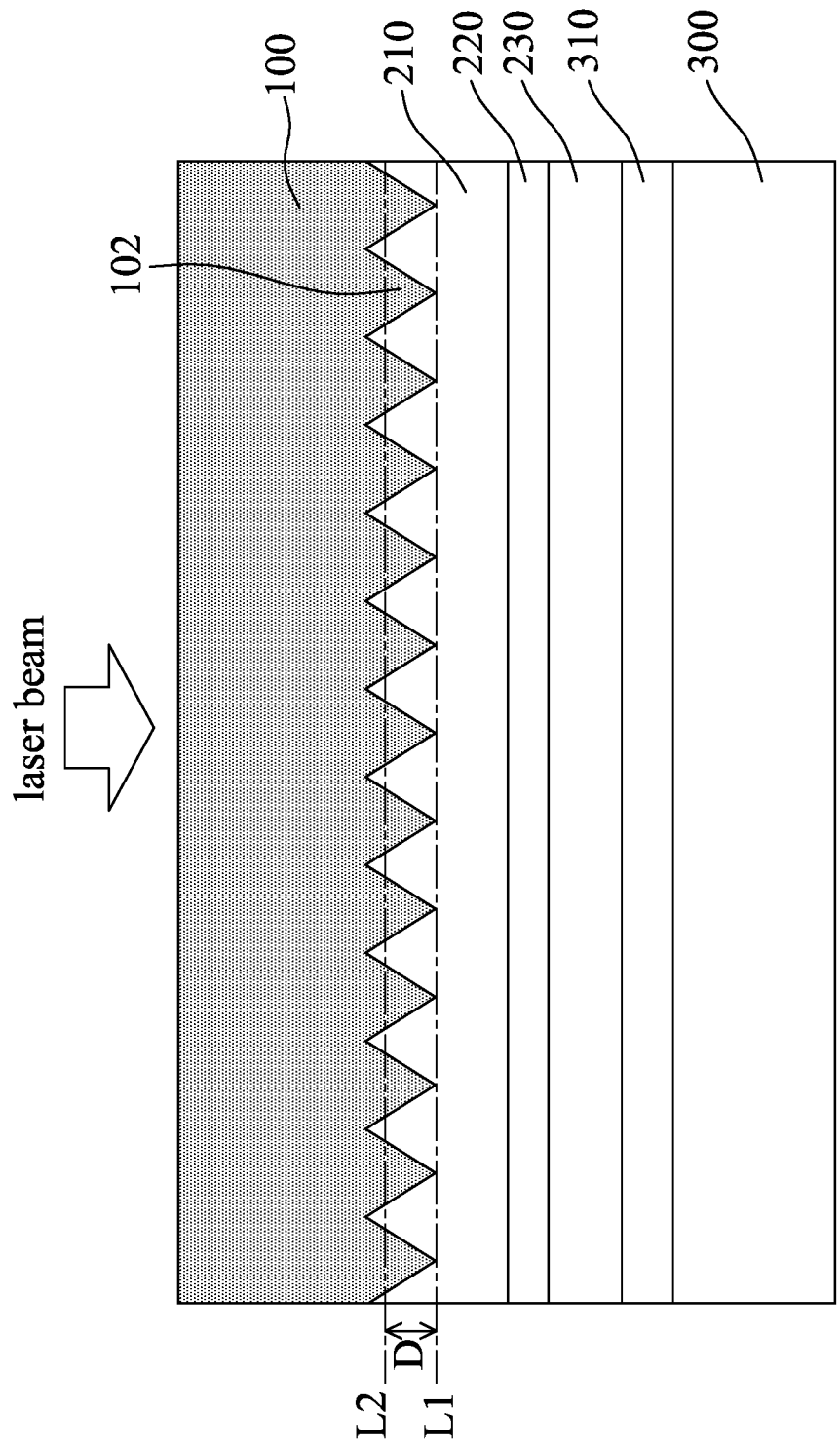
Figure 8:
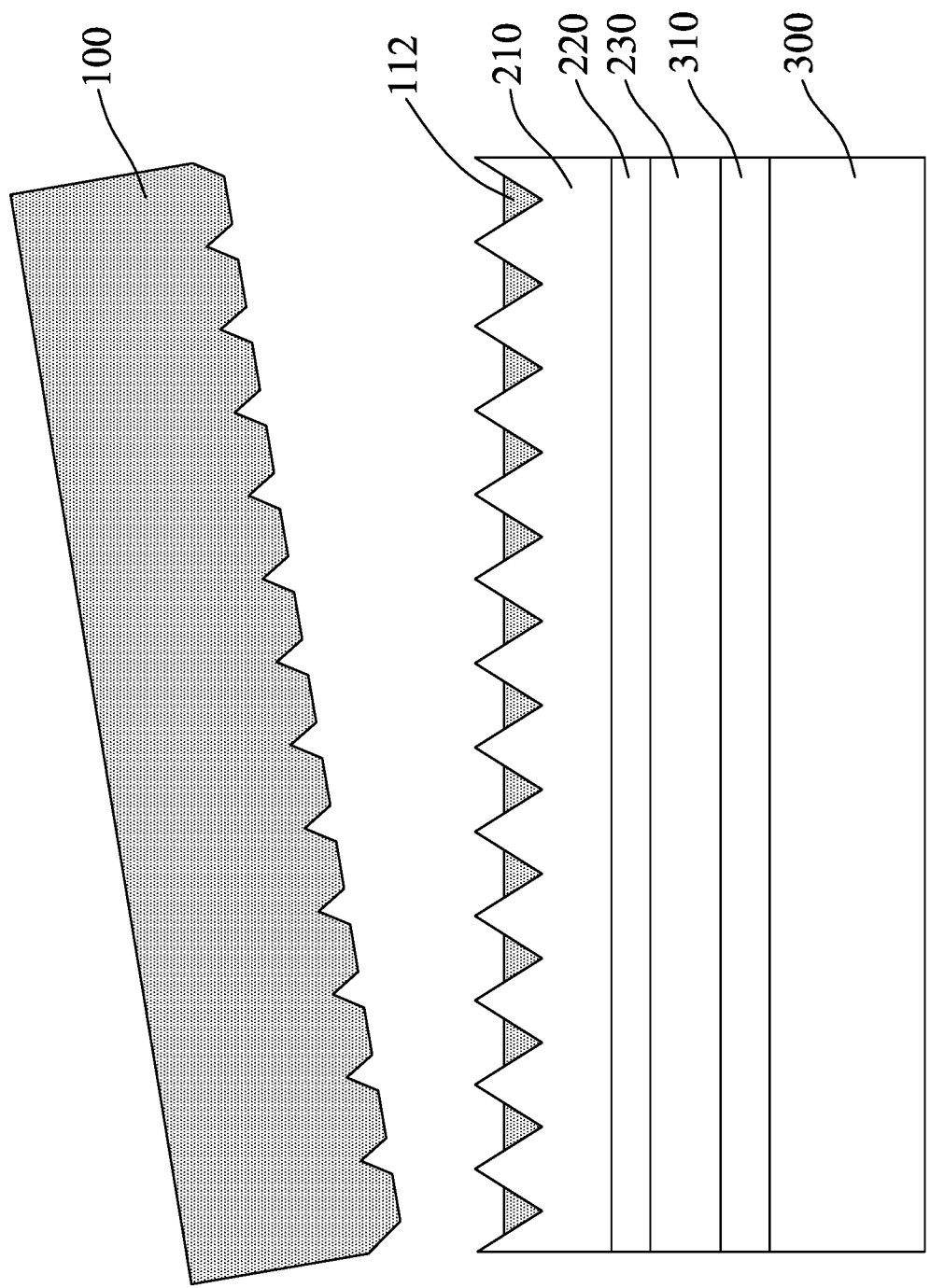

Referring to FIGS. 3, 7 and 8, in step S140, the light transmissible substrate 100 is partially removed from the light emitting epitaxial layer 200 to partially retain the protrusions 102 on the light emitting epitaxial layer 200 for serving as the microlenses 112, and a portion of the light emitting epitaxial layer 200 is exposed from the protrusions 102. In this embodiment, the partial removal of the light transmissible substrate 100 is carried out using laser ablation. Laser beams having an energy ranging from 100 mJ to 1000 mJ are used to be focused on the protrusions 102 to fracture the protrusions 102. Specifically, the laser beams are focused on an ablation area in the protrusions 102, which is indicated by a dotted line (L2) in FIG. 7, the ablation area being away from a farthermost portion of each of the protrusions 102 relative to the body 101 (i.e., the tip end of each of the protrusions 102 located at a dotted line (L1) in FIG. 7) by a distance (D) ranging from 0.5 μm to 1.5 μm.

Figure 9:
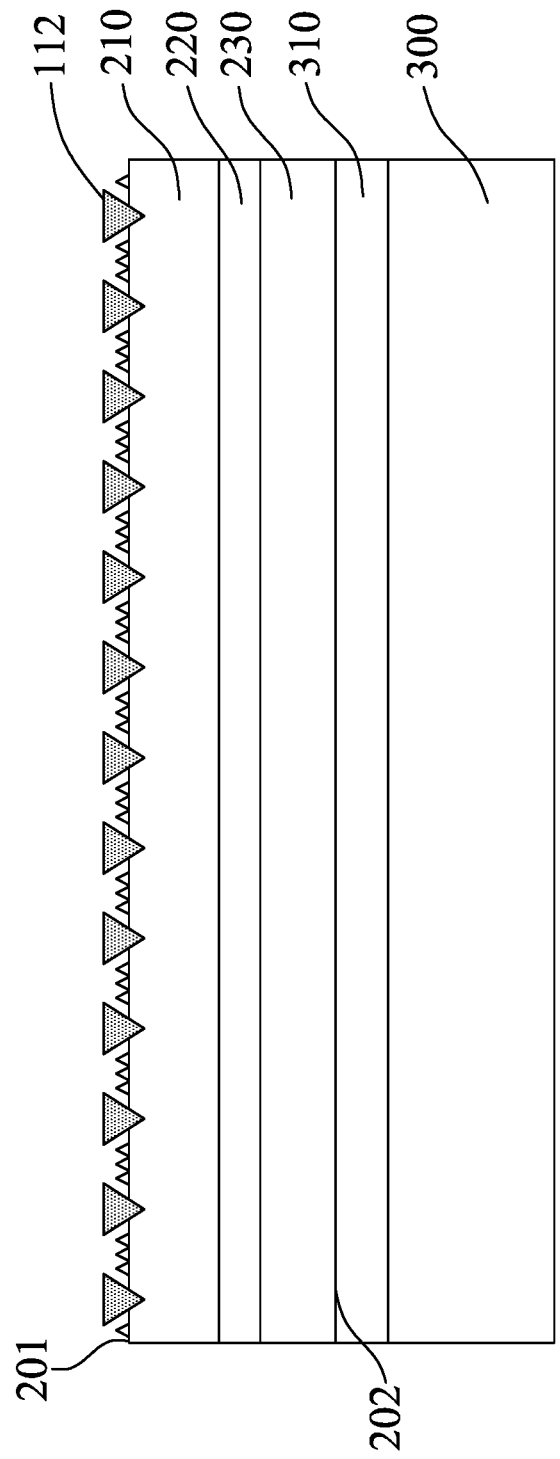

Referring to FIGS. 3 and 9, in step S150, after the partial removal of the light transmissible substrate 100, the microlenses 112 composed of a retained portion of the protrusions 102 on the light emitting epitaxial layer 200 are shaped using one of dry etching, wet etching and combinations thereof. The exposed portion of the light emitting epitaxial layer 200 are roughened through grinding, etching and combinations thereof to form a randomly or geometrically arranged pattern composed of a plurality of bumps. Each of the bumps may be prism-, cone-, sphere-, semisphere-, polygonal pyramid, or truncated polygonal pyramid-shaped.

At last, referring back to FIG. 1, the top electrode 410, which is an N-type electrode in this embodiment, is connected to corresponding ones of the microlenses 112 and a corresponding part of the roughened exposed portion of the light emitting epitaxial layer 200, thereby obtaining the LED device in the form of an LED chip. By way of forming the microlenses 112, light extraction efficiency and light coupling effect of the LED device as made can be increased, thereby enhancing light emitting efficiency of the LED device.

The abovementioned method according to this disclosure is adapted for manufacturing the light emitting device having a vertical structure, a flip-chip structure or a structure of same-sided-electrodes.

Figure 10:
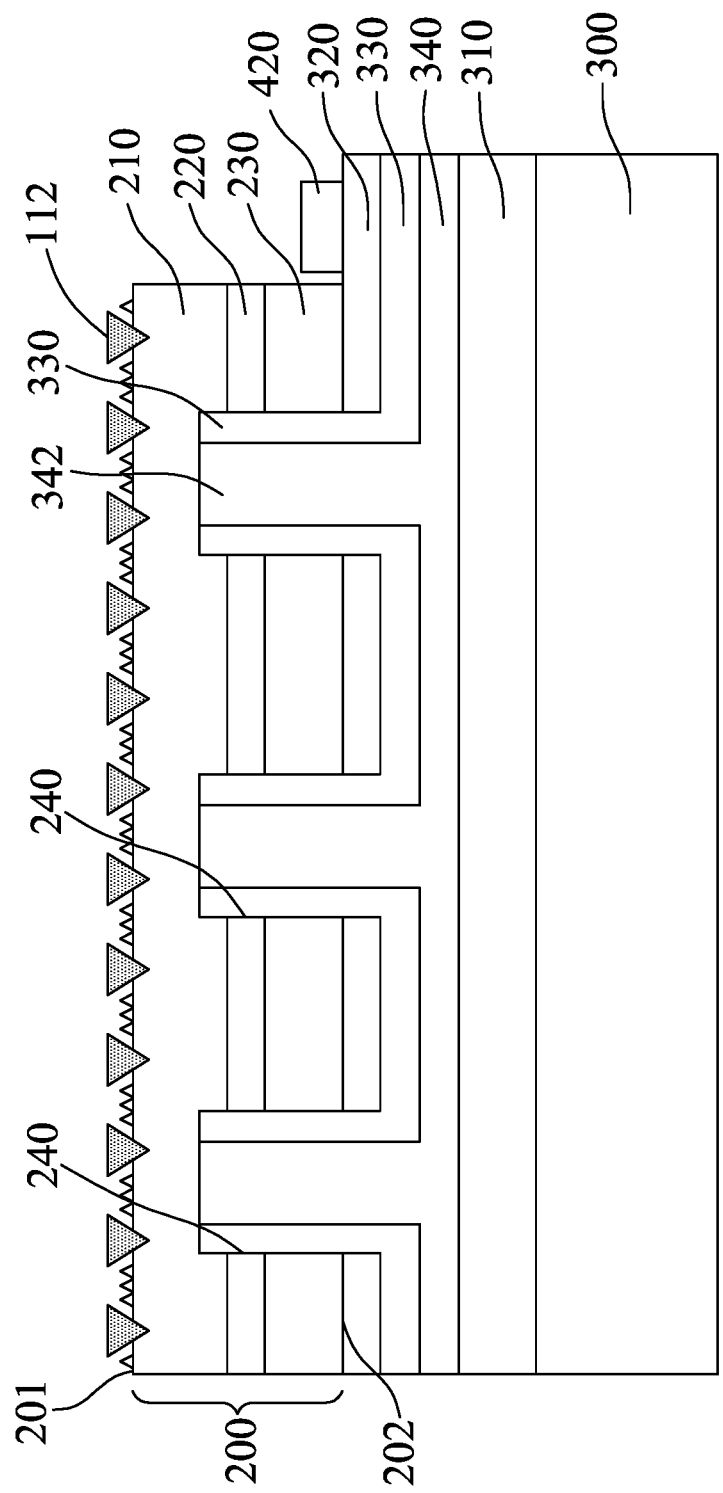
FIG. 10 is a schematic view showing a second embodiment of an LED device according to the disclosure.

Referring to FIG. 10, a second embodiment of an LED device according to the disclosure is another vertical-type LED device having a structure similar to the LED device of FIGS. 1 and 2. However, the light emitting epitaxial layer 200 is formed with a plurality of trenches 240. Each of the trenches 240 is indented from the second surface 202 and extends toward the first surface 201. Specifically, each of the trenches 240 penetrates the P-type semiconductor layer 230 and the light emitting layer 220 and terminates in the N-type semiconductor layer 210 to be spaced apart from the first surface 201. In this embodiment, the LED device includes a first electrically connecting layer 320, a dielectric layer 330 and a second electrically connecting layer 340 formed in that order on the second surface 202 of the light emitting epitaxial layer 200. The first electrically connecting layer 320 is formed on the second surface 202 to be electrically connected to the P-type semiconductor layer 230 and has an exposed portion uncovered by the light emitting epitaxial layer 200. A P-type electrode 420 is formed on the exposed portion of the first electrically connecting layer 320. The dielectric layer 330 is formed on the first electrically connecting layer 320 and extends into the trenches 240 to be in contact with the N-type semiconductor layer 210. The second electrically connecting layer 340, which serves as an N-type electrode, is formed on the dielectric layer 330 and has a plurality of filling portions 342. Each of the filling portions 342 extends into and fills a respective one of the trenches 240 so as to be in contact with the N-type semiconductor layer 210. Hence, the second electrically connecting layer 340 is in electrical connection with the N-type semiconductor layer 210 through the filling portions 342, and is in electrical connection with the support substrate 300 via the bonding layer 310 which is electroconductive.

In this embodiment, the N- and P-type electrodes 340, 420 are disposed on the same side of the support structure 300, enabling more uniform distribution of electric current of the LED device for generating a uniform light pattern. On one hand, current crowding effect is avoided and the LED device has a current density greater than 1 A/mm$^2$. On the other hand, forming electrodes on the first surface 201 for light exiting can be avoided, and thus, absorption of the emitting light by the N- and P-electrodes 340, 420 can be eliminated.

Figure 11:
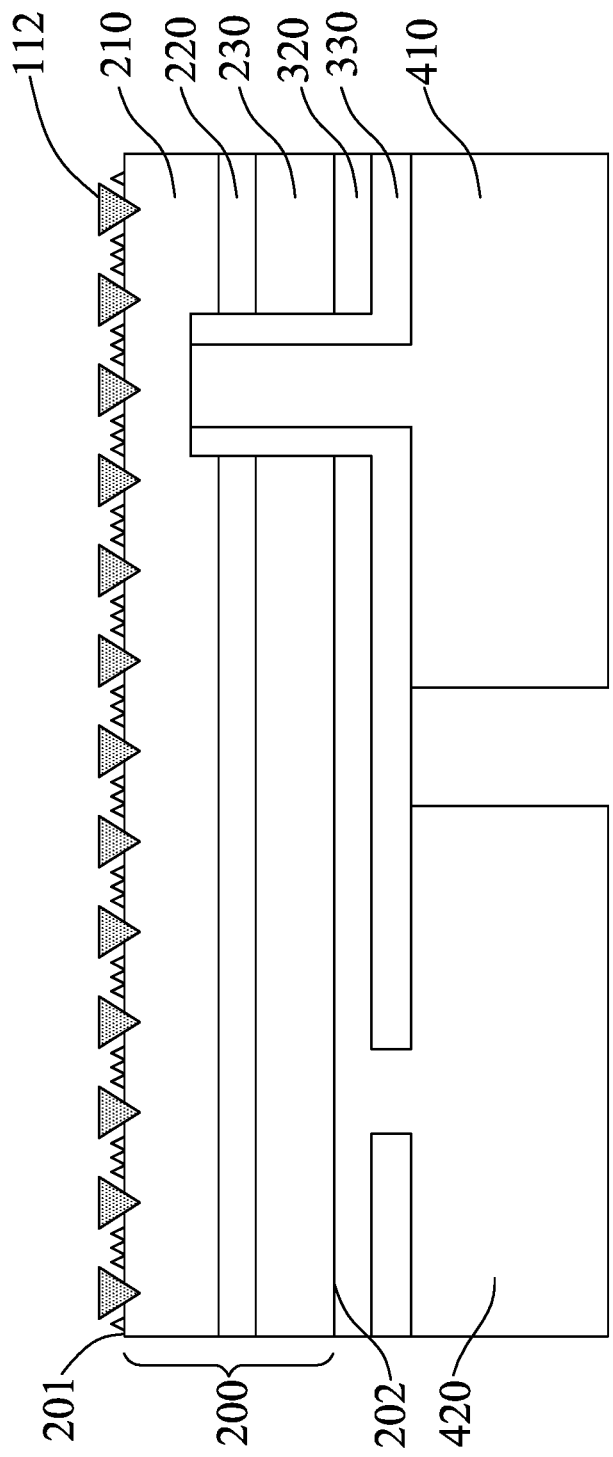
FIG. 11 is a schematic view showing a third embodiment of an LED device according to the disclosure.

Referring to FIG. 11, a third embodiment of an LED device according to the disclosure is a flip-chip structured LED device, which has the light emitting epitaxially layer 200 and the microlenses 112 similar to that of the LED device of FIGS. 1 and 2 and the N-type electrode 410 similar to that of the LED device of FIG. 10. In this embodiment, the first electrically connecting layer 320, which serves as a contact layer, is disposed on the P-type semiconductor layer 230, and the dielectric layer 330 is disposed on the contact layer 320. The N-electrode 410 is electrically connected with the N-type semiconductor layer 210 and the P-electrode 420 is electrically connected with the P-type semiconductor layer 230. The N- and P-electrodes 410, 420 are separated from each other by the dielectric layer 330. In this embodiment, the N-electrode 410 and the P-electrode 420 are both disposed on the same side of the light emitting epitaxial layer 200 proximate to the second surface 202 thereof. The N- and P-electrodes 410, 420 may have a thickness greater than 50 μm so as to have a mechanical strength sufficient to protect the light emitting epitaxial layer 200.

Figure 12:
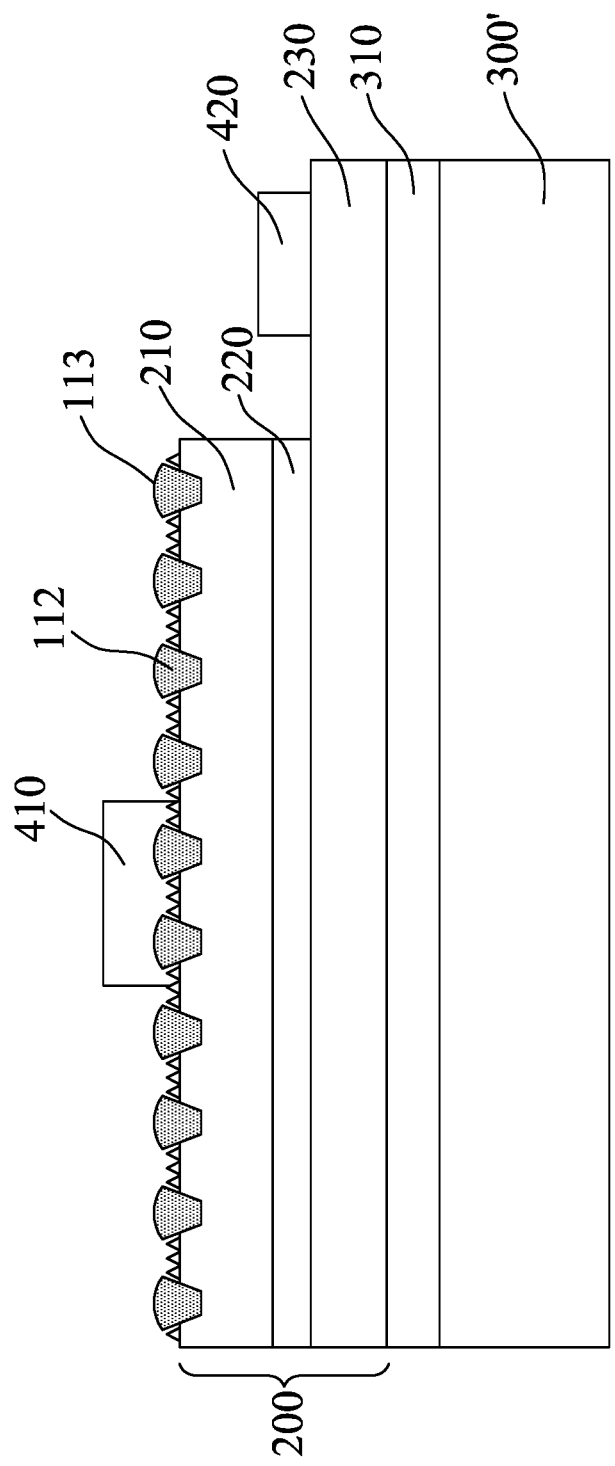
FIG. 12 is a schematic view showing a fourth embodiment of an LED device according to the disclosure.

FIG. 12 illustrates a fourth embodiment of an LED device according to the disclosure, which is horizontal-type LED device and which has the light emitting epitaxially layer 200, the microlenses 112, and the N-electrode 410 similar to that of the LED device of FIGS. 1 and 2. In this embodiment, the support structure 300' is an electrically insulating substrate. The bonding layer 310, the light emitting epitaxial layer 200, the N-type semiconductor 210 and the N-electrode 410 are formed in that order on the support structure 300'. The P-electrode 420 is formed on an exposed portion of the P-type semiconductor layer 230 uncovered by the N-type semiconductor layer 210 and the light emitting layer 220 so as to be spaced apart from the N-type semiconductor layer 210 and the light emitting layer 220. The N-electrode 410 formed on the N-type semiconductor layer 210 covers the corresponding ones of the microlenses 112 and the corresponding part of the roughened exposed portion of the light emitting epitaxial layer 200. The electrically insulating substrate 300' may be made of a heat conductive material. The top surface 113 of the microlenses 112 formed of the light transmissible substrate and formed on the N-type semiconductor layer 210 is curved.

Referring to FIGS. 13 to 18, a second embodiment of the method for manufacturing an LED device according to the disclosure will be illustrated. In this embodiment, the LED device of FIG. 12 is to be made.

Figure 13:
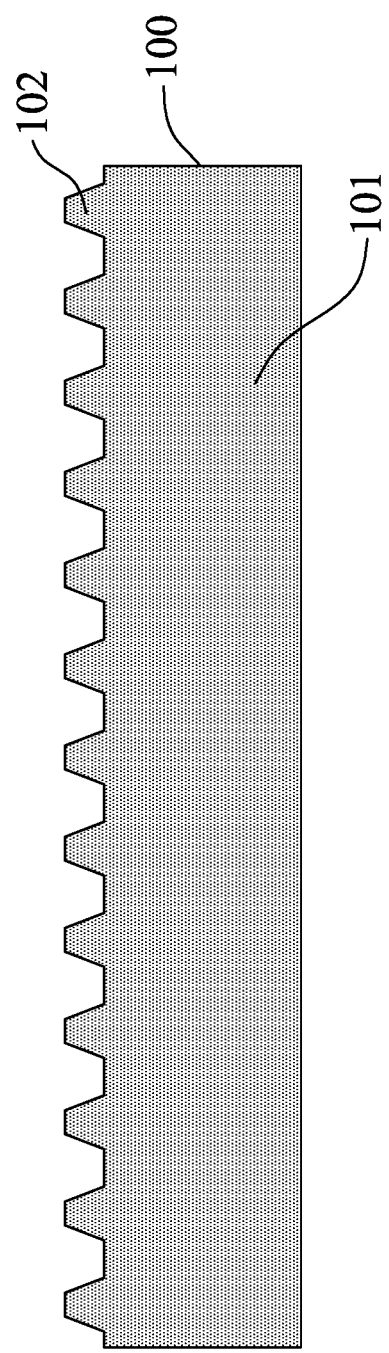
FIGS. 13 to 18 are schematic views illustrating consecutive steps of a second embodiment of a method for manufacturing an LED device according to the disclosure.

As shown in FIG. 13, similar to the step shown in FIG. 4, the light transmissible substrate 100 which is patterned to include a body 101 and a plurality of protrusions 102 is provided. Each of the protrusions 102 is truncated square pyramid-shaped and has a planar top surface distal to the main body 101. The protrusions 120 formed in this embodiment have the dimension and the distance (d1) thereamong similar to those of the first embodiment of the LED device shown in FIGS. 1 and 2.

Figure 14:
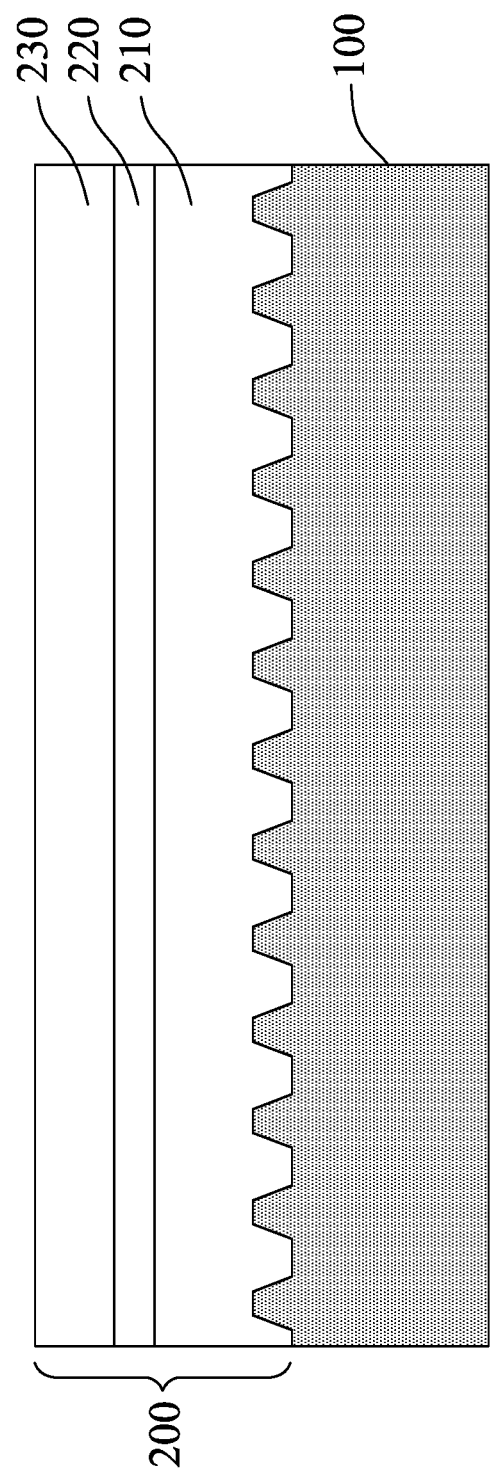
Figure 15:
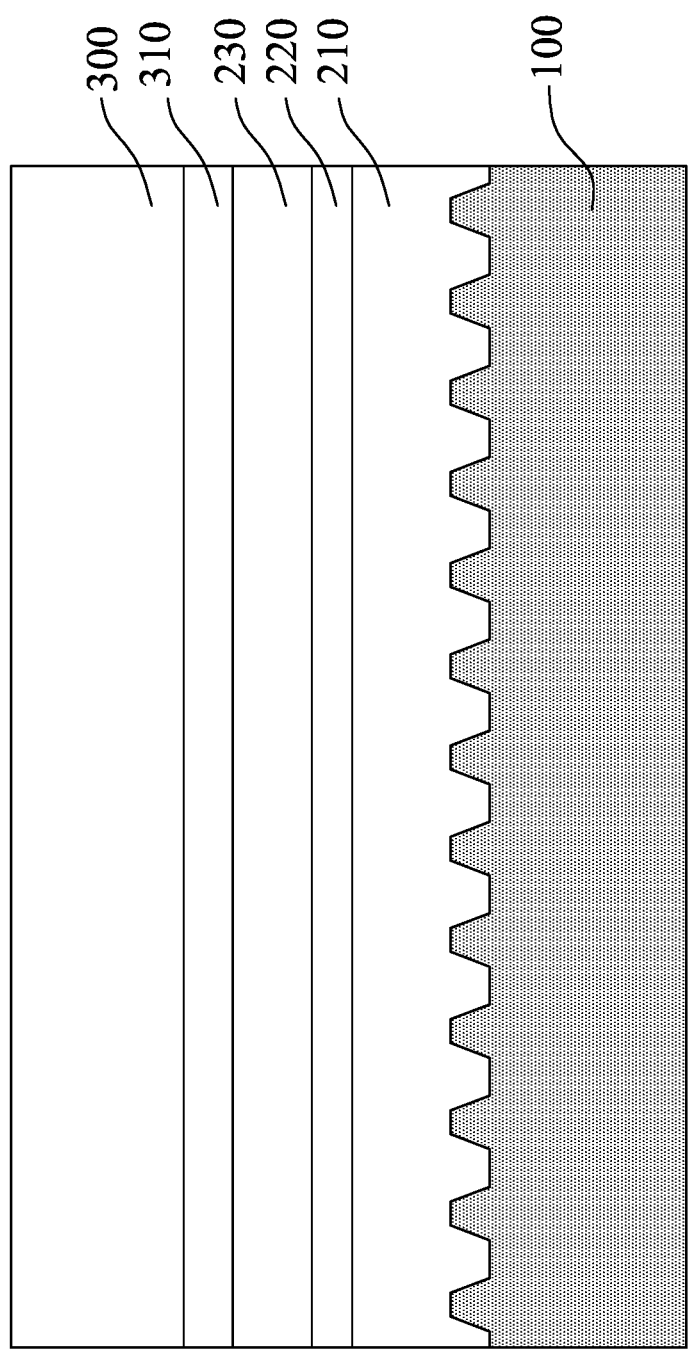
Figure 16:
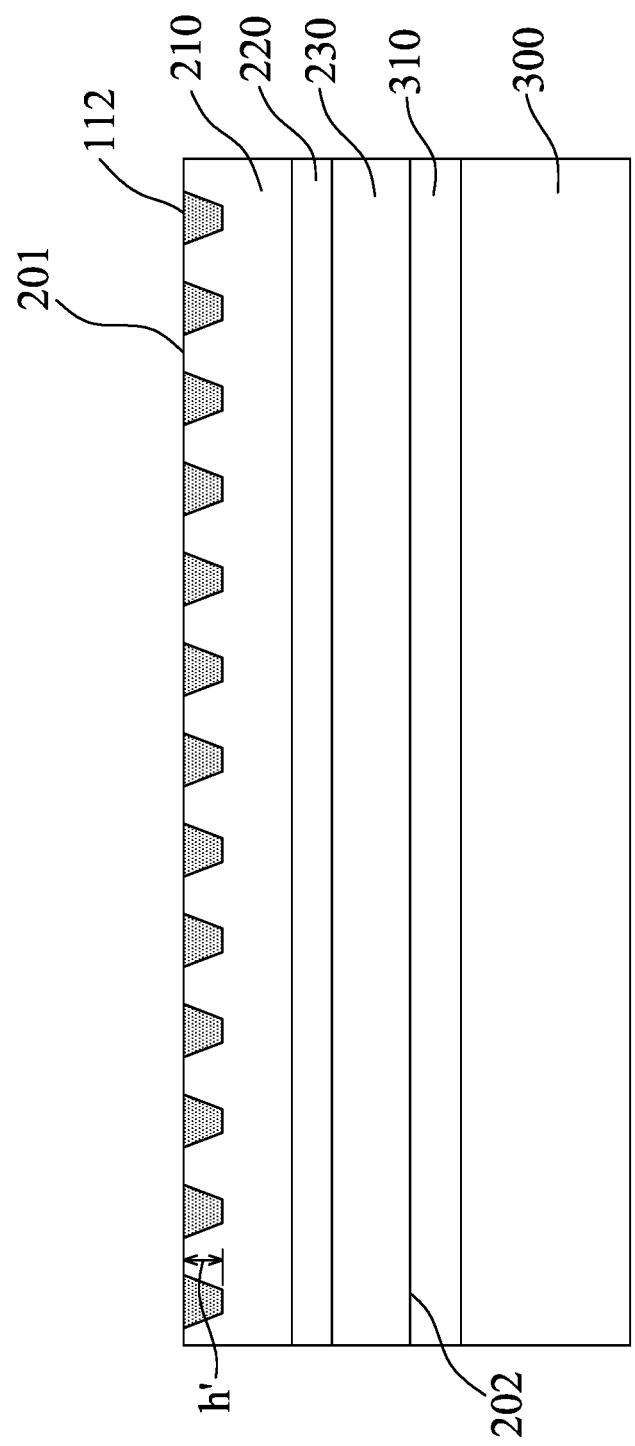

A shown in FIG. 14, the light emitting epitaxial layer 200 is formed on the light transmissible substrate 100, similar to the step shown in FIG. 5. As shown in FIG. 15, the light emitting epitaxial layer 200 is connected to the support substrate 300' via the bonding layer 310, similar to the step shown in FIG. 6. Then, as shown in FIG. 16, the light transmissible substrate 100 is partially removed by grinding, etching or combinations thereof to retain the protrusions 102 on the light emitting epitaxial layer 200 for serving as the microlenses 112 and to expose a portion of the light emitting epitaxial layer 200 from the protrusions 102. At least one of the microlenses 112 has a height (h') in a direction from the first surface 201 to the second surface 202 of the light emitting epitaxial layer 200 being of 0.5 µm to 3.0 µm.

Figure 17:
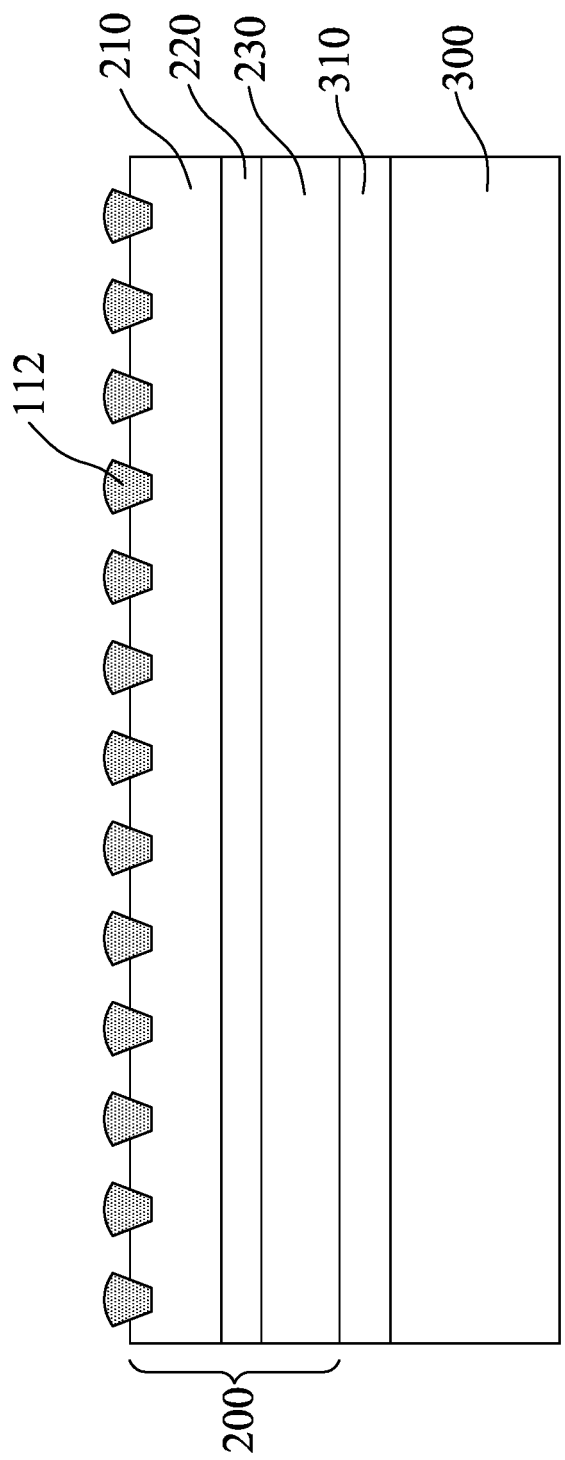

As shown in FIG. 17, in this embodiment, the microlenses 112 are shaped using dry etching or wet etching. In one example, the top surface 113 of the microlenses 112 is curved after shaping. The wet etching may be performed using concentrated sulfuric acid and phosphoric acid, while the dry etching may be performed using argon (Ar) gas.

Figure 18:
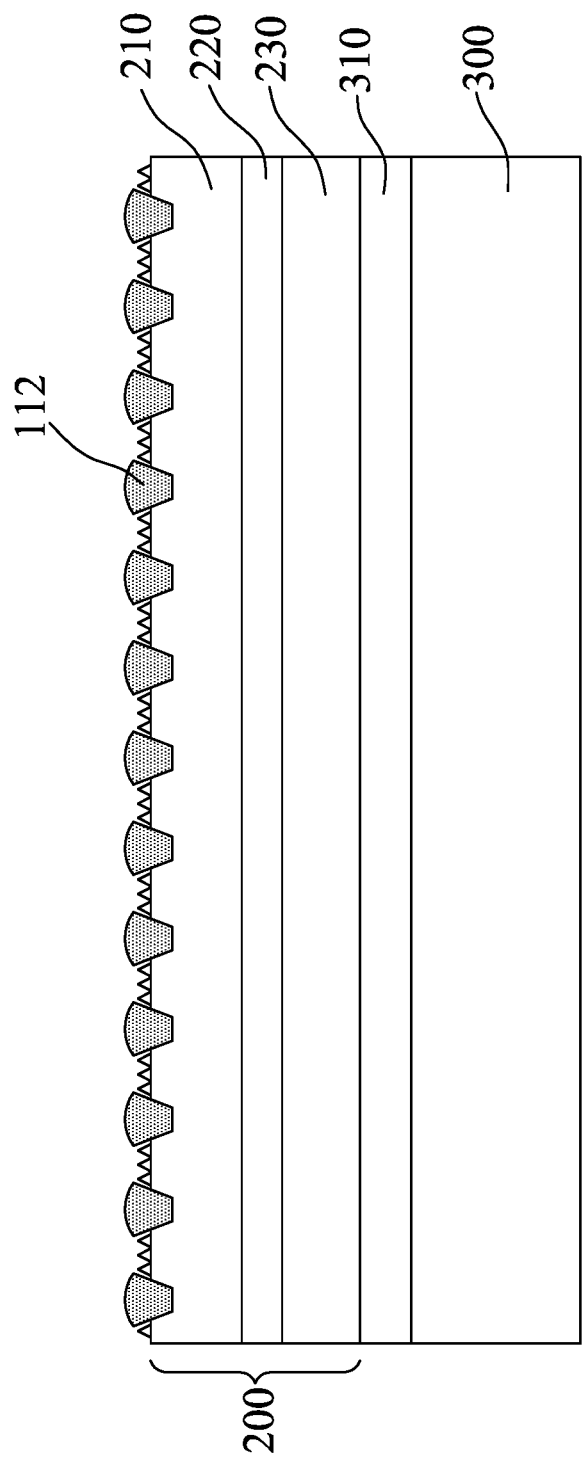

Then, as shown in FIG. 18, the exposed portion of the light emitting epitaxial layer 200 is roughened, similar to the step shown in FIG. 9.

Finally, a portion of the light emitting layer 220 and the N-type semiconductor layer 210 together with the microlenses 112 formed thereon are removed to form the exposed portion of the P-type semiconductor layer 230. Then, referring back to FIG. 12, the N-electrode 410 is connected to the corresponding ones of the microlenses 112 and a corresponding part of the roughened exposed portion of the light emitting epitaxial layer 200, and the P-electrode 420 is formed on the exposed portion of the P-type semiconductor layer 230, forming the horizontal LED device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode device, comprising:
a light emitting epitaxial layer having opposite first and second surfaces, and including:
a first type semiconductor layer that defines said first surface,
a second type semiconductor layer that defines said second surface, and
a light emitting layer that is disposed between said first and second type semiconductor layers and spaced apart from said first and second surfaces, said light emitting layer emitting light toward said first surface to exit therefrom; and
a plurality of microlenses directly formed on said first surface defined by said first type semiconductor layer and formed of a light transmissible substrate for epitaxial growth of said light emitting epitaxial layer, said microlenses being spaced apart from each other, a portion of said first surface of said light emitting epitaxial layer being thereby exposed between said microlenses.

2. The light emitting diode device of claim 1, further comprising a support structure disposed on said second surface.

3. The light emitting diode device of claim 1, wherein each of said microlenses tapers along a direction from said first surface toward said second surface, and has a height of 0.5 to 3.0 µm in the direction.

4. The light emitting diode device of claim 1, wherein each of said microlenses has a top surface spaced apart from said first surface of said light emitting epitaxial layer, and a side surface peripherally extending from said top surface toward said first surface, said top surface and said side surface cooperatively defining an interior angle included therebetween, the interior angle being of 30° to 85°.

5. The light emitting diode device of claim 1, wherein said microlenses are spaced apart from each other by a distance ranging from 1.0 µm to 6.0 µm.

6. The light emitting diode device of claim 1, wherein each of said microlenses has a top surface spaced apart from said first surface of said light emitting epitaxial layer, said top surface of at least one of said microlenses being curved or planar.

7. The light emitting diode device of claim 1, wherein each of said microlenses includes a first portion and a second portion extending from said first portion, said first portion being embedded in said light emitting epitaxial layer, said second portion protruding from said first surface of said light emitting epitaxial layer.

8. The light emitting diode device of claim 1, wherein said first type semiconductor layer is one of a P-type semiconductor layer and an N-type semiconductor layer, and said second type semiconductor layer is the other one of said P-type semiconductor layer and said N-type semiconductor layer.

* * * * *